United States Patent
Nguyen et al.

(10) Patent No.: US 7,485,337 B2
(45) Date of Patent: *Feb. 3, 2009

(54) DEPOSITING AN ORGANIC LAYER FOR USE IN OLEDS

(75) Inventors: Kelvin Nguyen, Rochester, NY (US); Lee W. Tutt, Webster, NY (US); Michael L. Boroson, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 975 days.

This patent is subject to a terminal disclaimer.

(21) Appl. No.: 10/854,918

(22) Filed: May 27, 2004

(65) Prior Publication Data

US 2005/0266152 A1 Dec. 1, 2005

(51) Int. Cl.
*B05D 5/06* (2006.01)
(52) U.S. Cl. .......................... 427/66; 445/24; 428/690; 313/504; 427/457; 430/201; 430/945
(58) Field of Classification Search .................. 427/66, 427/457; 445/24; 428/690; 313/504
See application file for complete search history.

(56) References Cited

U.S. PATENT DOCUMENTS

| | | | |
|---|---|---|---|
| 5,688,551 | A | 11/1997 | Littman et al. |
| 5,937,272 | A | 8/1999 | Tang |
| 6,114,088 | A | 9/2000 | Wolk et al. |
| 6,140,009 | A | 10/2000 | Wolk et al. |
| 6,169,565 | B1 | 1/2001 | Ramanujan et al. |
| 6,214,520 | B1 | 4/2001 | Wolk et al. |
| 6,221,553 | B1 | 4/2001 | Wolk et al. |
| 6,582,875 | B1 | 6/2003 | Kay et al. |
| 2002/0086232 | A1 | 7/2002 | Nirmal et al. |
| 2002/0197554 | A1 | 12/2002 | Wolk et al. |

*Primary Examiner*—Timothy H Meeks
*Assistant Examiner*—Jimmy Lin
(74) *Attorney, Agent, or Firm*—Raymond L. Owens

(57) ABSTRACT

A method of transferring organic material from a donor element onto a substrate of an OLED device, includes providing a linear laser light beam which is moved relative to the donor element and substrate and which has a predetermined number of laser modulatable channels, each of which when activated causes laser light to illuminate the donor element which heats to a sufficient level to vaporize organic material and transfer such material onto a substrate; and selecting the pattern of activated laser modulatable channels such that only a portion of the OLED device receives organic material during a single relative motion pass of the linear laser light beam to the donor element and substrate.

18 Claims, 7 Drawing Sheets

DEPOSITING AN ORGANIC LAYER FOR USE IN OLEDS

CROSS-REFERENCE TO RELATED APPLICATIONS

Reference is made to commonly assigned U.S. patent Application commonly assigned U.S. patent application Ser. No. 10/855,719 filed concurrently herewith by Kelvin Nguyen et al., entitled "Linear Laser Light Beam for Making OLEDS", and commonly assigned U.S. patent application Ser. No. 10/855,679 filed concurrently herewith by Kelvin Nguyen et al., entitled "Plural Metallic Layers In OLED Donor", the disclosures of which are incorporated herein by reference.

FIELD OF THE INVENTION

The present invention relates to organic electroluminescent (EL) devices, also known as organic light-emitting diodes (OLED), and to a donor element and a method of using such donor element for making such OLED devices.

BACKGROUND OF THE INVENTION

In color or full-color organic electroluminescent (EL) displays (also known as organic light-emitting diode devices, or OLED devices) having an array of colored pixels such as red, green, and blue color pixels (commonly referred to as RGB pixels), precision patterning of the color-producing organic EL media are required to produce the RGB pixels. The basic OLED device has in common an anode, a cathode, and an organic EL medium sandwiched between the anode and the cathode. The organic EL medium can consist of one or more layers of organic thin films, where one of the layers is primarily responsible for light generation or electroluminescence. This particular layer is generally referred to as the emissive layer or light-emitting layer of the organic EL medium. Other organic layers present in the organic EL medium can provide electronic transport functions primarily and are referred to as either the hole-transporting layer (for hole transport) or electron-transporting layer (for electron transport). In forming the RGB pixels in a full-color OLED display panel, it is necessary to devise a method to precisely pattern the emissive layer of the organic EL medium or the entire organic EL medium.

In commonly assigned U.S. Pat. No. 5,937,272, Tang has taught a method of patterning multicolor pixels (e.g. red, green, blue subpixels) onto a thin-film-transistor (TFT) array substrate by vapor deposition of an EL material. Such EL material is deposited on a substrate in a selected pattern via the use of a donor coating on a support and an aperture mask.

Using an unpatterned donor sheet and a precision light source, such as a laser, is another method of radiation transfer. Such a method is disclosed by Littman in U.S. Pat. No. 5,688,551, and in a series of patents by Wolk et al. (U.S. Pat. Nos. 6,114,088; 6,140,009; 6,214,520; and 6,221,553). Kay et al., in U.S. Pat. No. 6,582,875, have described the use of a multichannel laser for the light source to accelerate the radiation thermal transfer process.

While this is a useful technique for manufacturing, EL devices that include emissive layers prepared this way often suffer from decreased stability relative to El devices with emissive layers prepared in other ways, e.g. vapor deposition.

There is a need to improve the stability of electroluminescent devices prepared using a radiation thermal transfer process.

SUMMARY OF THE INVENTION

It is therefore an object of the present invention to improve the stability of electroluminescent devices prepared using a radiation thermal transfer process.

This object is achieved by a method of transferring organic material from a donor element onto a substrate of an OLED device, comprising:

(a) providing a linear laser light beam which is moved relative to the donor element and substrate and which has a predetermined number of laser modulatable channels, each of which when activated causes laser light to illuminate the donor element which beats to a sufficient level to vaporize organic material and transfer such material onto a substrate; and (b) selecting the pattern of activated laser modulatable channels such that only a portion of the OLED device receives organic material during a single relative motion pass of the linear laser light beam to the donor element and substrate.

It is an advantage of this invention that it can improve the lifetime of an OLED device prepared via a radiation thermal transfer process. In some embodiments, this improvement is achievable with little or no loss in manufacturing efficiency.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "OLED device" or "organic light-emitting display" is used in its art-recognized meaning of a display device comprising organic light-emitting diodes as pixels. A color OLED device emits light of at least one color. The term "multicolor" is employed to describe a display panel that is capable of emitting light of a different hue in different areas. In particular, it is employed to describe a display panel that is capable of displaying images of different colors. These areas are not necessarily contiguous. The term "full color" is commonly employed to describe multicolor display panels that are capable of emitting in the red, green, and blue regions of the visible spectrum and displaying images in any combination of hues. The red, green, and blue colors constitute the three primary colors from which all other colors can be generated by appropriate mixing. However, the use of additional colors to extend the color gamut of the device is possible. The term "hue" refers to the intensity profile of light emission within the visible spectrum, with different hues exhibiting visually discernible differences in color. The term "pixel" is employed in its art-recognized usage to designate an area of a display panel that can be stimulated to emit light independently of other areas. However, it is recognized that in full-color systems, several pixels of different colors will be used together to generate a broad range of colors, and a viewer may term such a group a single pixel.

Figure 1:
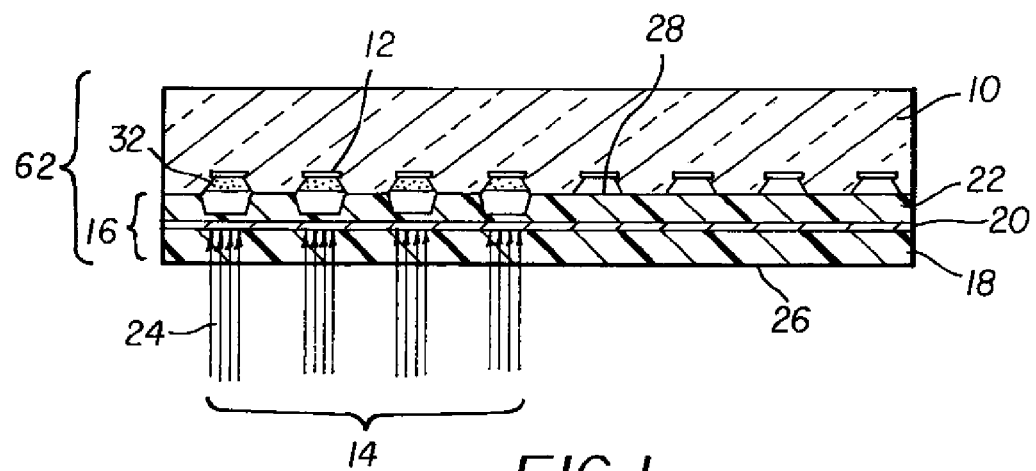
FIG. 1 shows a cross-sectional view of a prior art method of transferring organic material from a donor element onto a substrate of an OLED device.

Turning now to FIG. 1, there is shown a cross-sectional view of a prior art method of transferring organic material from a donor element 16 onto a substrate 10 of an OLED device. Linear laser light beam 14 can be generated by a multichannel laser printhead. Such a printhead has been described by Ramanujan and Kurtz in commonly assigned U.S. Pat. No. 6,169,565, and its use in fabricating OLED devices by radiation thermal transfer has been described by Kay et al. in commonly assigned U.S. Pat. No. 6,582,875, the contents of which are incorporated by reference. Linear laser light beam 14 has a predetermined number of laser modulatable channels and is movable as described by Kay in a first direction which will be referred to as the fast scan direction, and a second direction which will be referred to as the slow scan direction. Linear laser light beam 14 is movable relative to substrate 10 in multiple fast and slow passes and can provide two or more passes in the fast scan direction if required. Relative movement between linear laser light beam 14 and substrate 10 can be provided by a variety of means, e.g. by moving the multichannel laser printhead, by moving substrate 10, or by methods of moving the linear laser light beam 14 (e.g. mirrors) while maintaining the position of substrate 10 and the printhead. When activated, a laser modulatable channel will cause laser light to illuminate donor element 16 which heats to a sufficient level to vaporize organic material 22 and transfer the organic material onto substrate 10 as deposited organic material 32.

Figure 2:
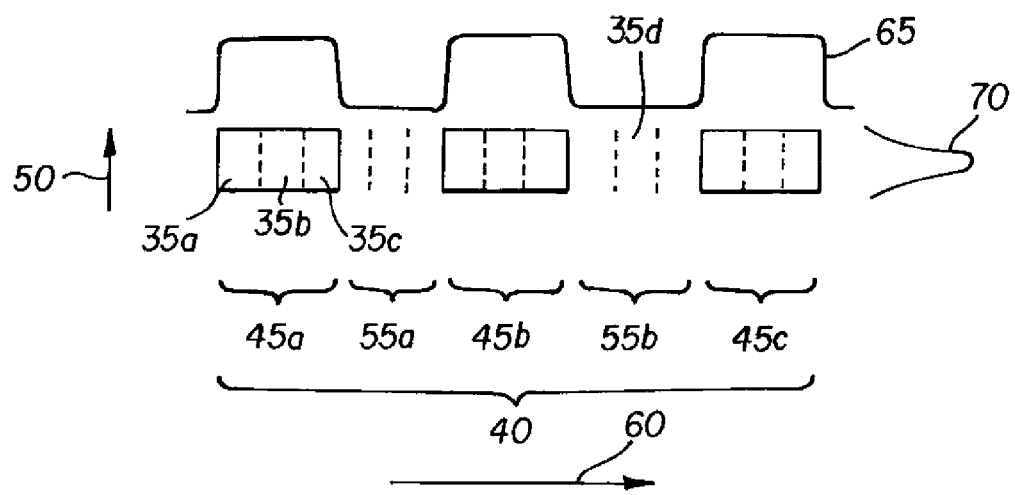
FIG. 2 shows a cross-sectional view of a prior art linear laser light beam that has been modulated into segments of light.

FIG. 2 shows a cross-sectional view of a prior art linear laser light beam 40 that has been modulated or segmented into one or more segments of light. This is shown schematically as pixel linear laser light beam segments 45a, 45b, and 45c, which are activated linear laser light beam segments and are separated by non-pixel linear laser light beam segments 55a and 55b, which are inactivated linear laser light beam segments. Each pixel linear laser light beam segment includes several activated laser modulatable channels of light, e.g. laser modulatable channels 35a, 35b, and 35c, as described by Kay et al., for pixel linear laser light beam segment 45a. As described by Kay et al., sufficient adjacent laser modulatable channels are activated to transfer organic material 22 to an entire pixel 12. Non-pixel linear laser light beam segments (55a, 55b) between pixel linear laser light beam segments include one or more inactivated laser modulatable channels, e.g. laser modulatable channel 35d. Inactivated laser modulatable channels such as 35d represent channels that have been modulated to prevent the passage of laser light, while the activated laser modulatable channels have been modulated to allow the passage of laser light. Each pixel linear laser light beam segment (e.g. 45a) is selected to fully illuminate the width of a single pixel of the OLED device, while each non-pixel linear laser light beam segment (e.g. 55a) is selected for areas wherein no transfer of organic material 22 is desired, such as regions between pixels or on pixels of a different color in a multicolor device. For example, if donor element 16 includes blue light-emitting material, it is desired to transfer it only to blue pixels, and red and green pixels would be considered non-pixel areas for the step of transferring blue light-emitting material. As linear laser light beam 40 is scanned in fast scan direction 50, it fully illuminates each selected pixel in its path, and can be differently modulated to illuminate different pixels in different regions of the OLED device.

Light intensity profiles 65 and 70 show the relative power distributions of power of linear laser light beam 40 in the slow scan direction 60 and fast scan direction 50, respectively. The width of each laser modulatable channel, that is, its dimension in slow scan direction 60, is in the range of 0.1 microns to 1 millimeter. The dimension of each laser modulatable channel in fast scan direction 50 (which is the direction of movement if only a single scan is performed) is in the range of 0.1 to 50 microns. As shown by the light intensity profiles, the channel boundary is relatively sharp in slow scan direction 60. In fast scan direction 50, the boundaries of the channels are considered to be the $1/e^2$ points.

Figure 3A:
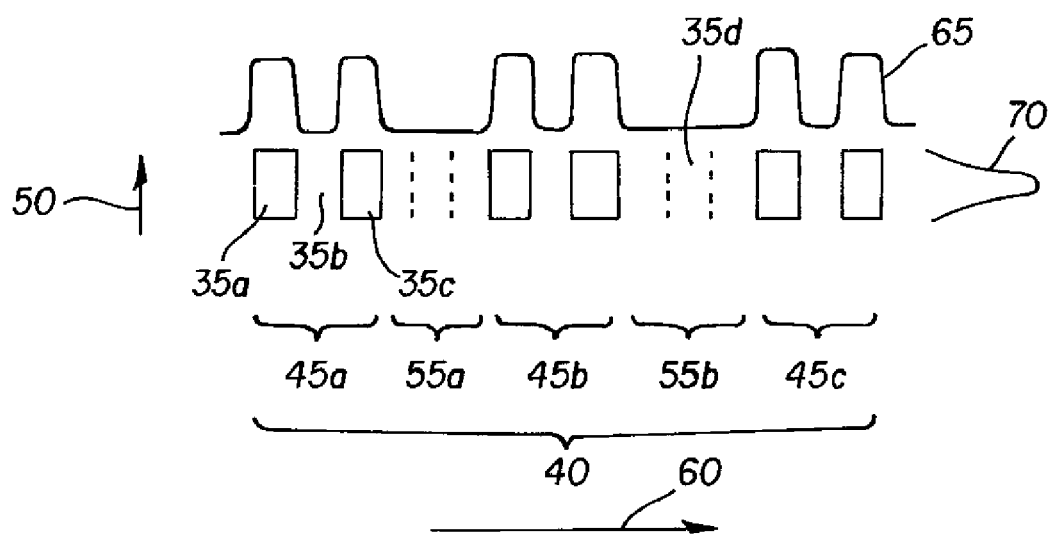
FIG. 3a shows one embodiment of a linear laser light beam that has been modulated into segments of light in accordance with this invention.

It has been found unexpectedly that partial illumination of a pixel region in a secured substrate donor element 62 or illumination in two or more steps can lead to improved results in an OLED device. One method of doing this is to select the pattern of activated laser modulatable channels so as to activate a plurality of laser modulatable channels but to not activate at least one inactivated channel between each of the activated channels. FIG. 3a shows one embodiment of a linear laser light beam that has been modulated into segments of light in accordance with this invention. Laser modulatable channels 35a and 35c of pixel linear laser light beam segment 45a are activated, while laser modulatable channel 35b between them is not activated. Thus, if laser modulatable channels 35a, 35b, and 35c correspond to the width of a pixel 12 on substrate 10, only a portion of the area of pixel 12 will be illuminated and therefore only a portion of organic material 22 over pixel 12 will be vaporized. This is shown in FIG. 4, which shows a cross-sectional view of a method according to this invention of transferring organic material from a donor element onto a substrate of an OLED device. The pattern of activated laser modulatable channels of linear laser light beam 40 has been selected such that only a portion of substrate 10 of the OLED device receives organic material during a single relative motion pass of linear laser light beam 40. This is shown as deposited organic material 34, which covers only a portion of the pixel. Further, the pattern of activated laser modulatable channels can be varied during movement of linear laser light beam 40 in fast scan direction 50. For example, during a portion of the passage of linear laser light beam 40 over a pixel or row of pixels, laser modulatable channel 35b can be activated, while laser modulatable channels 35a and 35c can be simultaneously inactivated, as in FIG. 3b, which shows another embodiment in which linear laser light beam 40 has been modulated into segments of light in accordance with this invention. By alternating these two patterns, organic material 22 can be vaporized onto pixel 12 in an alternating pattern, such as a checkerboard pattern.

We will now further describe the donor element and substrate used in this invention, and the resulting OLED device. Donor element 16 and substrate 10 are in a transfer relationship, that is, donor element 16 is placed on or close to substrate 10. They can be held together as a secured substrate/donor element 62 by means such as described by Phillips in U.S. Patent Application Publication 2003/014870. Donor element 16 includes support 18, energy-absorbing layer 20, and a layer of organic material 22. Support 18 thus includes non-transfer surface 26 and organic material 22 includes transfer surface 28 of donor element 16. Donor element 16 is unpatterned, that is, energy-absorbing layer 20 and organic material 22 are coated evenly on the surface of support 18. When activated, the activated laser modulatable channels (e.g. activated laser modulatable channel 24) cause laser light to illuminate donor element 16. The laser light is absorbed by and heats selected portions of energy-absorbing layer 20 and thereby heats selected portions of donor element 16 to a sufficient level to vaporize selected portions of organic material 22 and to transfer such material onto substrate 10 to become deposited organic material 34.

Support 18 can be made of any of several materials which meet at least the following requirements: The support 18 must be capable of maintaining the structural integrity during the light-to-heat-induced transfer step while pressurized on one side, and during any preheating steps contemplated to remove volatile constituents such as water vapor. Additionally, support 18 must be capable of receiving on one surface a relatively thin coating of organic donor material, and of retaining this coating without degradation during anticipated storage periods of the coated support. Support materials meeting these requirements include, for example, metal foils, certain plastic foils which exhibit a glass transition temperature value higher than a support temperature value anticipated to cause transfer of the transferable organic donor materials of the coating on the support, and fiber-reinforced plastic foils. While selection of suitable support materials can rely on known engineering approaches, it will be appreciated that certain aspects of a selected support material merit further consideration when configured as a donor support useful in the practice of the invention. For example, the support 18 can require a multi-step cleaning and surface preparation process prior to precoating with transferable organic material. If the support material is a radiation-transmissive material, the incorporation into the support 18 or onto a surface thereof, of a radiation-absorptive material can be advantageous to more effectively heat the donor support and to provide a correspondingly enhanced transfer of transferable organic donor material from the support 18 to the substrate 10, when using laser light from a suitable laser.

The energy-absorbing layer 20 is disposed over support 18. Energy-absorbing layer 20 can be disposed on support 18, or it can be disposed over intervening layers. Energy-absorbing layer 20 is capable of absorbing light in a predetermined portion of the spectrum, and in response to such light, producing heat. Energy-absorbing layer 20 can include a dye such as the dyes specified in U.S. Pat. No. 5,578,416, a pigment such as carbon, or a metal such as nickel, chromium, titanium, etc.

Substrate 10 can be an organic solid, an inorganic solid, or a combination of organic and inorganic solids that provides a surface for receiving the emissive material from a donor and can be rigid or flexible. Typical substrate materials include glass, plastic, metal, ceramic, semiconductor, metal oxide, semiconductor oxide, semiconductor nitride, or combinations thereof. Substrate 10 can be a homogeneous mixture of materials, a composite of materials, or multiple layers of materials. Substrate 10 can be an OLED substrate, that is, a substrate commonly used for preparing OLED devices, e.g. active-matrix low-temperature polysilicon TFT substrate. The substrate 10 can either be light transmissive or opaque, depending on the intended direction of light emission. The light transmissive property is desirable for viewing the EL emission through the substrate 10. Transparent glass or plastic are commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, ceramics, and circuit board materials, or any others commonly used in the formation of OLED devices, which can be either passive-matrix devices or active-matrix devices. Substrate 10 can be coated with other layers prior to this step.

Organic material 22 can include the material to form a hole-transporting layer, a light-emitting layer, or an electron-transporting layer, which are common components of OLED devices. It is useful for organic material 22 to include a light-emitting layer, which can include a host material and a light-emitting dopant. Host materials can include hole-transporting material or electron-transporting material. In the OLED device, the host material serves to dilute the dopant material and thereby inhibit self-quenching. The host also can modify the emissive characteristic of the dopant to achieve different hues.

Hole-transporting materials useful as host materials and as hole-transporting layers are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active-hydrogen-containing group are disclosed by Brantley et al in U.S. Pat. No. 3,567,450 and U.S. Pat. No. 3,658,520.

A more preferred class of aromatic tertiary amines are those which include at least two aromatic tertiary amine moieties as described in U.S. Pat. No. 4,720,432 and U.S. Pat. No. 5,061,569. Such compounds include those represented by structural formula (A).

A

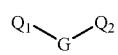

wherein $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural formula (A) and containing two triarylamine moieties is represented by structural formula (B):

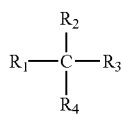

where $R_1$ and $R_2$ each independently represents a hydrogen atom, an aryl group, or an alkyl group or $R_1$ and $R_2$ together represent the atoms completing a cycloalkyl group; and $R_3$ and $R_4$ each independently represents an aryl group, which is in turn substituted with a diaryl substituted amino group, as indicated by structural formula (C):

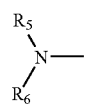

wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by formula (C), linked through an arylene group. Useful tetraaryldiamines include those represented by formula (D).

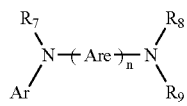

wherein each Are is an independently selected arylene group, such as a phenylene or anthracene moiety, n is an integer of from 1 to 4, and Ar, $R_7$, $R_8$, and $R_9$ are independently selected aryl groups.

In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural formulae (A), (B), (C), (D), can each in turn be substituted. Typical substituents include alkyl groups, alkoxy groups, aryl groups, aryloxy groups, and halogens such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring-carbon atoms—e.g., cyclopentyl, cyclohexyl, and cycloheptyl ring structures. The aryl and arylene moieties are usually phenyl and phenylene moieties.

The hole-transporting layer can be formed of a single or a mixture of aromatic tertiary amine compounds. Specifically, one can employ a triarylamine, such as a triarylamine satisfying the formula (B), in combination with a tetraaryldiamine, such as indicated by formula (D). When a triarylamine is employed in combination with a tetraaryldiamine, the latter is positioned as a layer interposed between the triarylamine and the electron-injecting and transporting layer. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N-Phenylcarbazole
Poly(N-vinylcarbazole)
N,N'-di-1-naphthalenyl-N,N'-diphenyl-4,4'-diaminobiphenyl
4,4'-Bis[N-(1-naphthyl)-N-phenylamino]biphenyl
4,4"-Bis[N-(1-naphthyl)-N-phenylamino]-p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Electron-transporting materials useful as host materials and as electron-transporting layers include metal complexes of 8-hydroxyquinoline and similar derivatives (Formula E), which constitute one class of useful host compounds capable of supporting electroluminescence, and are particularly suitable for light emission of wavelengths longer than 500 nm, e.g., green, yellow, orange, and red.

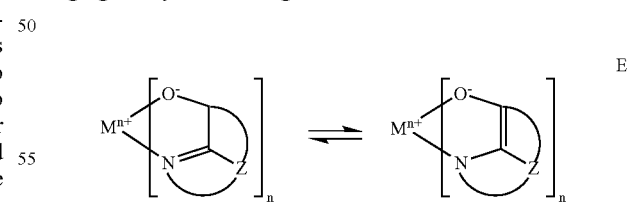

wherein

M represents a metal;

n is an integer of from 1 to 3; and

Z independently in each occurrence represents the atoms completing a nucleus having at least two fused aromatic rings.

From the foregoing it is apparent that the metal can be a monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato)aluminum(III)]
CO-2: Magnesium bisoxine [alias, bis(8-quinolinolato)magnesium(II)]
CO-3: Bis[benzo{f}-8-quinolinolato]zinc (II)
CO-4: Bis(2-methyl-8-quinolinolato)aluminum(III)-82-oxo-bis(2-methyl-8-quinolinolato) aluminum(III)
CO-5: Indium trisoxine [alias, tris(8-quinolinolato)indium]
CO-6: Aluminum tris(5-methyloxine) [alias, tris(5-methyl-8-quinolinolato) aluminum(III)]
CO-7: Lithium oxine [alias, (8-quinolinolato)lithium(I)]

Derivatives of 9,10-di-(2-naphthyl)anthracene (Formula F) constitute one class of useful hosts capable of supporting electroluminescence, and are particularly suitable for light emission of wavelengths longer than 400 nm, e.g., blue, green, yellow, orange or red.

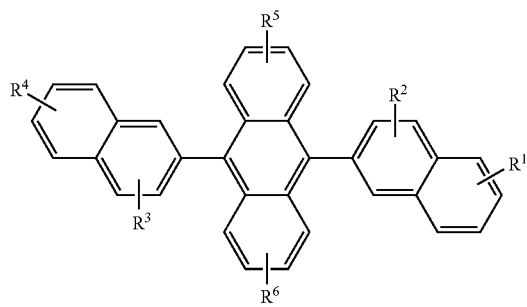

F wherein: $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;
Group 2: aryl or substituted aryl of from 5 to 20 carbon atoms;
Group 3: carbon atoms from 4 to 24 necessary to complete a fused aromatic ring of anthracenyl; pyrenyl, or perylenyl;
Group 4: heteroaryl or substituted heteroaryl of from 5 to 24 carbon atoms as necessary to complete a fused heteroaromatic ring of furyl, thienyl, pyridyl, quinolinyl or other heterocyclic systems;
Group 5: alkoxylamino, alkylamino, or arylamino of from 1 to 24 carbon atoms; and
Group 6: fluorine, chlorine, bromine or cyano.

Benzazole derivatives (Formula G) constitute another class of useful hosts capable of supporting electroluminescence, and are particularly suitable for light emission of wavelengths longer than 400 nm, e.g., blue, green, yellow, orange or red.

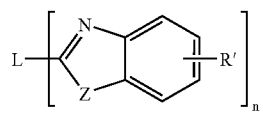

G

Where:
n is an integer of 3 to 8;
Z is O, NR or S; and
R' is hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring;
L is a linkage unit consisting of alkyl, aryl, substituted alkyl, or substituted aryl, which conjugately or unconjugately connects the multiple benzazoles together.

An example of a useful benzazole is 2,2',2"-(1,3,5-phenylene)tris[1-phenyl-1H-benzimidazole].

Desirable fluorescent dopants include derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, and carbostyryl compounds. Dopant materials are typically coated as 0.01 to 10% by weight relative to the host material. Illustrative examples of useful dopants include, but are not limited to, the following:

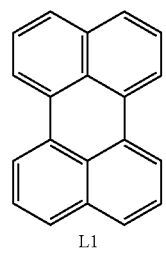

L1

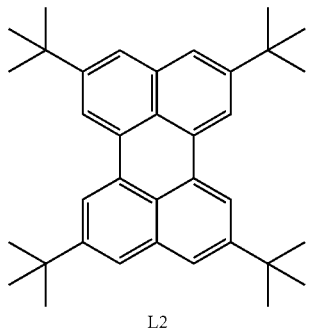

L2

-continued

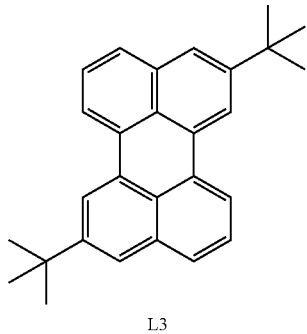

L3

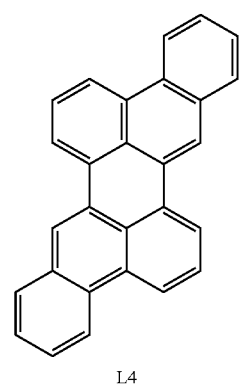

L4

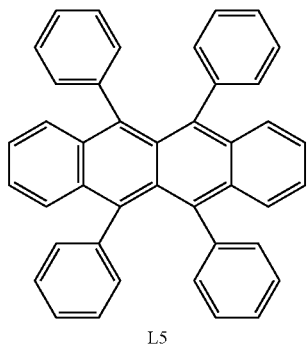

L5

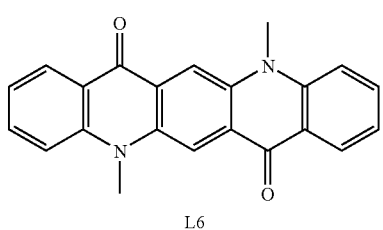

L6

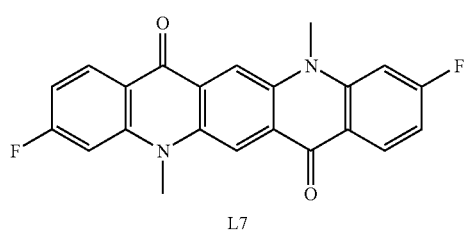

L7

-continued

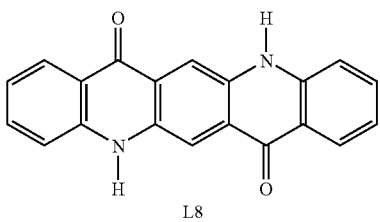

L8

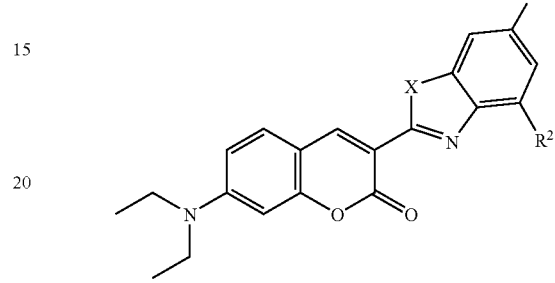

|     | X | R1     | R2     |
|-----|---|--------|--------|
| L9  | O | H      | H      |
| L10 | O | H      | Methyl |
| L11 | O | Methyl | H      |
| L12 | O | Methyl | Methyl |
| L13 | O | H      | t-butyl |
| L14 | O | t-butyl | H     |
| L15 | O | t-butyl | t-butyl |
| L16 | S | H      | H      |
| L17 | S | H      | Methyl |
| L18 | S | Methyl | H      |
| L19 | S | Methyl | Methyl |
| L20 | S | H      | t-butyl |
| L21 | S | t-butyl | H     |
| L22 | S | t-butyl | t-butyl |

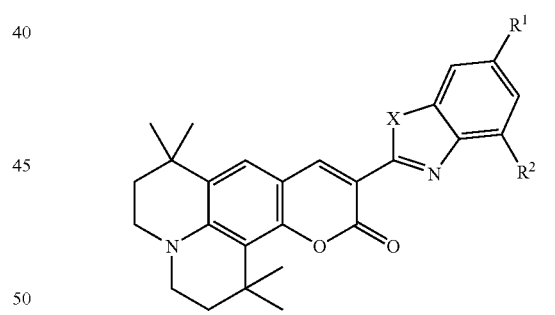

|     | X | R1     | R2     |
|-----|---|--------|--------|
| L23 | O | H      | H      |
| L24 | O | H      | Methyl |
| L25 | O | Methyl | H      |
| L26 | O | Methyl | Methyl |
| L27 | O | H      | t-butyl |
| L28 | O | t-butyl | H     |
| L29 | O | t-butyl | t-butyl |
| L30 | S | H      | H      |
| L31 | S | H      | Methyl |
| L32 | S | Methyl | H      |
| L33 | S | Methyl | Methyl |
| L34 | S | H      | t-butyl |
| L35 | S | t-butyl | H     |
| L36 | S | t-butyl | t-butyl |

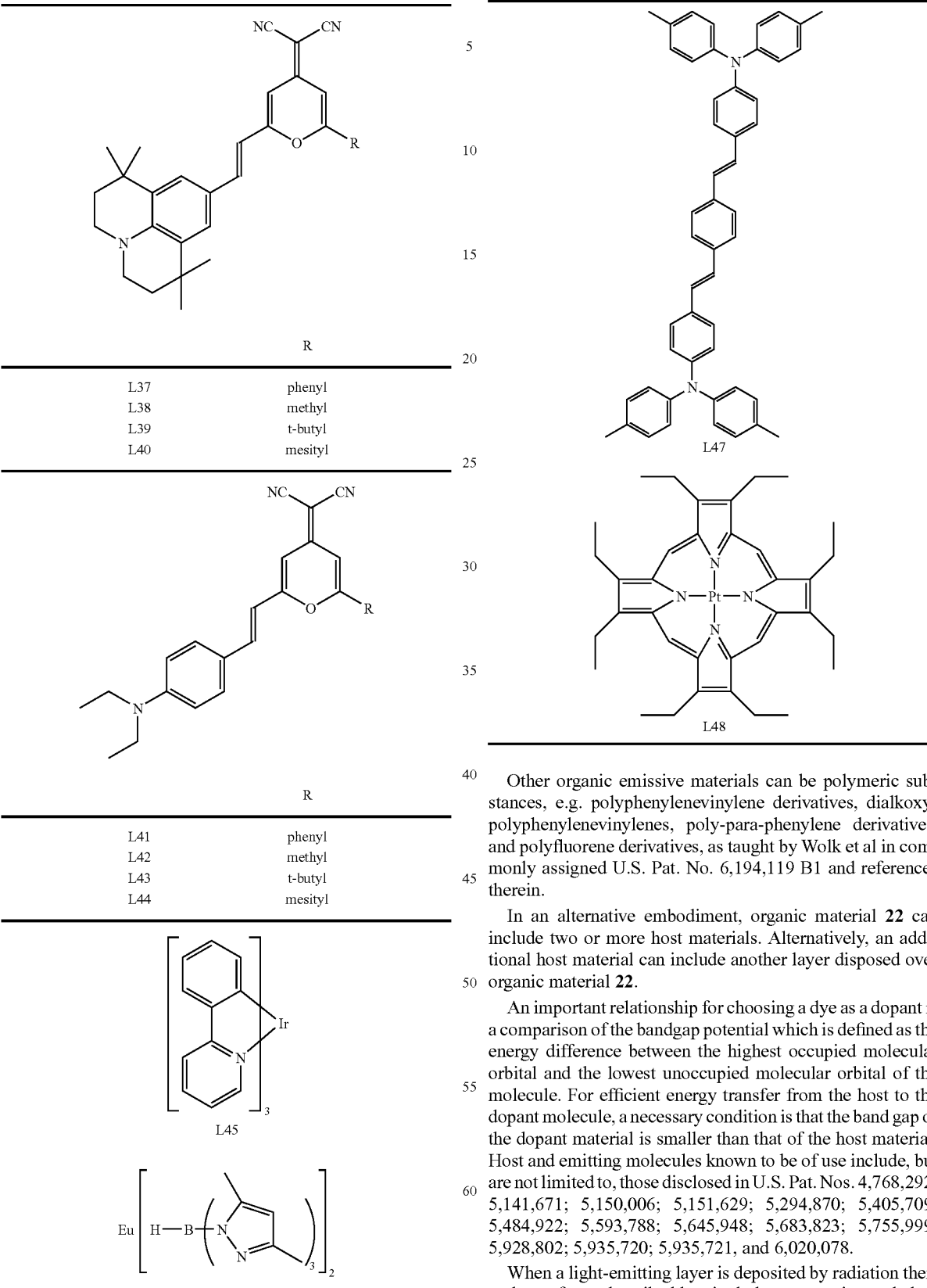

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk et al in commonly assigned U.S. Pat. No. 6,194,119 B1 and references therein.

In an alternative embodiment, organic material 22 can include two or more host materials. Alternatively, an additional host material can include another layer disposed over organic material 22.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant material is smaller than that of the host material. Host and emitting molecules known to be of use include, but are not limited to, those disclosed in U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721, and 6,020,078.

When a light-emitting layer is deposited by radiation thermal transfer as described herein, hole-transporting and electron-transporting layers can also be deposited by radiation thermal transfer or by any other suitable means such as evaporation, sputtering, chemical vapor deposition, or electrochemical means, or patterned using well-known photolithographic processes.

In addition to the layers described above, an OLED device will include a cathode and an anode, and can also include such layers as a hole-injecting layer, an electron-injecting layer, hole-blocking or electron-blocking layers, reflectors, semi-transparent reflectors, and color filters. Some of these can be already deposited on substrate 10 prior to the radiation thermal transfer step. The conductive anode layer is formed over the substrate and, when EL emission is viewed through the anode, should be transparent or substantially transparent to the emission of interest. Common transparent anode materials used in this invention are indium-tin oxide and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as an anode material. For applications where EL emission is viewed through the top electrode, the transmissive characteristics of the anode material are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials can be deposited by any suitable means such as evaporation, sputtering, chemical vapor deposition, or electrochemical means. Anode materials can be patterned using well-known photolithographic processes. The bottom electrode (that is, the electrode on substrate 10) is most commonly configured as the anode, but the practice of this invention is not limited to that configuration.

An OLED device includes a cathode. When light emission is through the anode, the cathode material can include nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers includes a thin layer of a low work function metal or metal salt capped with a thicker layer of conductive metal. One such cathode is comprised of a thin layer of LiF followed by a thicker layer of Al as described in U.S. Pat. No. 5,677,572. Other useful cathode materials include, but are not limited to, those disclosed in U.S. Pat. Nos. 5,059,861; 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 5,776,623. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser transfer, and selective chemical vapor deposition.

While not always necessary, it is often useful that a hole-injecting layer be provided in an organic light-emitting display. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, and plasma-deposited fluorocarbon polymers as described in U.S. Pat. No. 6,208,075. Alternative hole-injecting materials reportedly useful in organic EL devices are described in EP 0 891 121 A1 and EP 1,029,909 A1.

Figure 5:
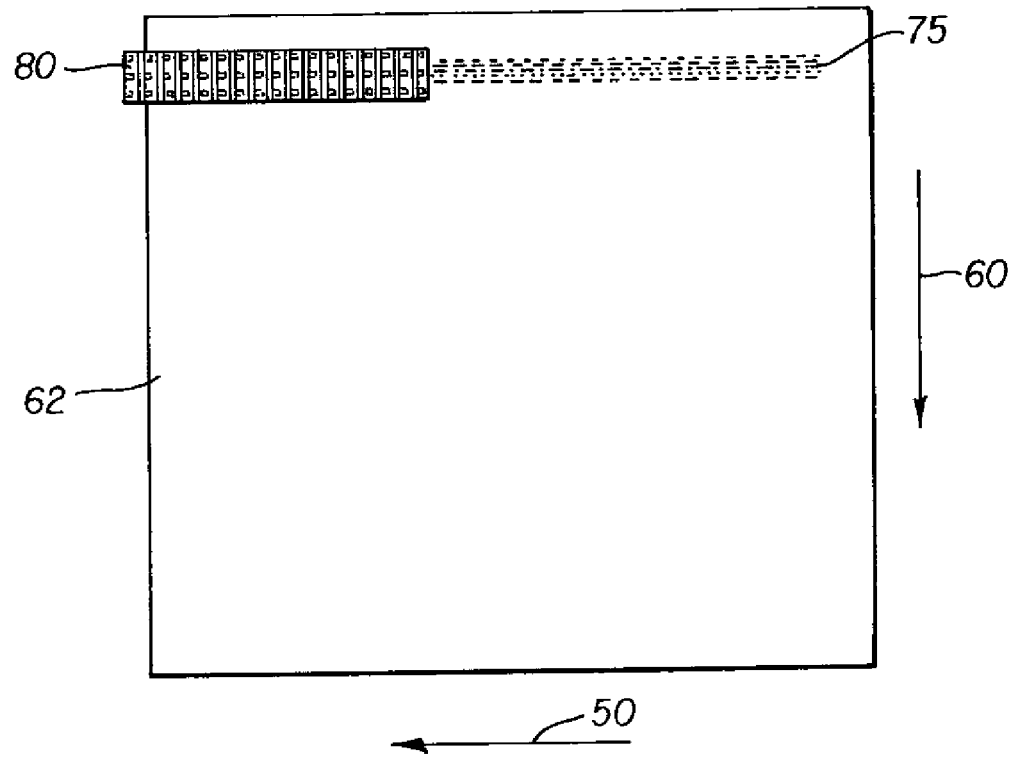
FIG. 5 shows a top view of a multichannel laser printhead irradiating a secured substrate/donor element in a pattern.

Turning now to FIG. 5, there is shown a top view of multichannel laser printhead 80 irradiating secured substrate/donor element 62 in a pattern. This is one method as described above wherein linear laser light beam 40 is moved relative to the donor element and substrate. For this discussion, it will be representative of all methods of providing relative motion between linear laser light beam 40 and the substrate. Relative movement is provided as described by Kay et al. between multichannel laser printhead 80 and secured substrate/donor element 62. A spatial light modulator, as described by Ramanujan and Kurtz, allows the individual laser modulatable channels (e.g. 35a) to be turned on and off independently as multichannel laser printhead 80 is moved in fast scan direction 50. Multichannel laser printhead 80, and therefore the linear laser light beam 40 that it generates, is moved in fast scan direction 50 at a velocity of from 1 mm/sec to 100 m/sec. This allows the creation of a predetermined linear path or swath 75 of laser pattern on the non-transfer surface of donor element 16. Swath 75 includes a series of predetermined positions where it is desirable to irradiate secured substrate/donor element 62 so as to cause the deposition of organic material 22 at the positions of the pixels, such as at the TFT anodes of an active matrix device in the manner described herein.

After a pass of multichannel laser printhead 80 and linear laser light beam 40 in fast scan direction 50, multichannel laser printhead 80 and its linear laser light beam 40 can be moved in slow scan direction 60 so that deposited organic material 22 from the new pass will not overlap deposited organic material from a previous pass. Alternatively, multichannel laser printhead 80 can make a second pass in fast scan direction 50 over the same area so as to deposit organic material 22 in the portions where no transfer occurred in the earlier pass.

Figure 6:
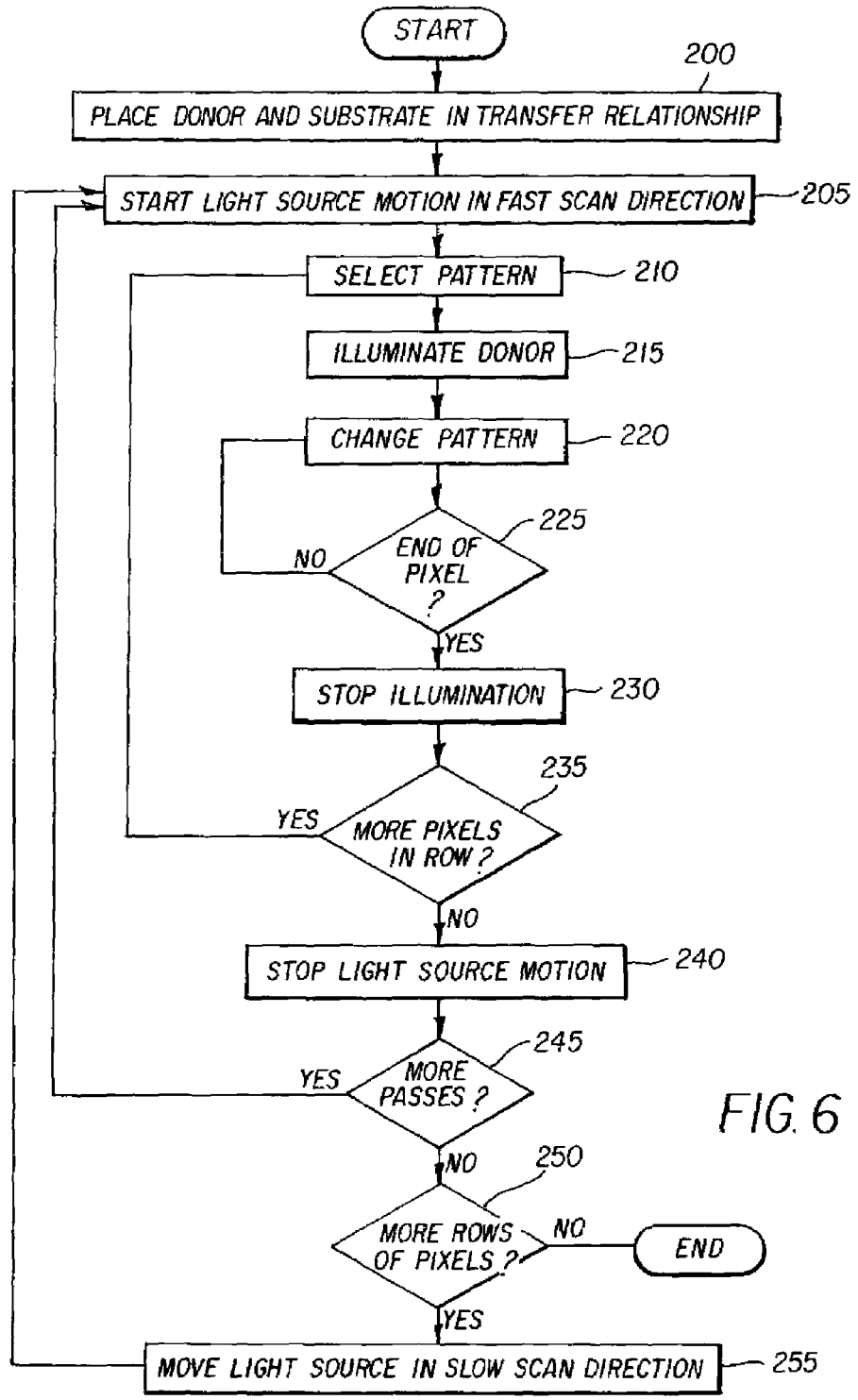
FIG. 6 is a block diagram of one embodiment of a method of transferring organic material from a donor element onto a substrate of an OLED device in accordance with this invention.

Turning now to FIG. 6, there is shown a block diagram of one embodiment of a method of transferring organic material 22 from the donor element 16 onto the substrate 10 of an OLED device in accordance with this invention. At the start, donor element 16 and substrate 10 are placed together in a transfer relationship as secured substrate/donor element 62 (Step 200). Relative motion of the light source is started in the fast scan direction 50 (Step 205). A pattern of illumination is selected (Step 210) and the selected parts of the linear laser light beam 40 then illuminate secured substrate/donor element 62 (Step 215). Those skilled in the art will understand the exact order of Steps 205, 210, and 215 can vary somewhat with the same result. After a predetermined distance, the pattern of illumination by linear laser light beam 40 can be changed (Step 220) and illumination can be continued. After a further predetermined distance, if the end of the pixel has not been reached (Step 225), the pattern can be changed again. If the end of the pixel has been reached (Step 225), illumination of secured substrate/donor element 62 is stopped (Step 230). If there are more pixels in the same direction to be illuminated (Step 235), Steps 210 to 225 are repeated for the next pixel. Steps 230 and 235 prevent organic material 22 from being transferred to a portion of substrate 10 that is between pixels, e.g. an inter-pixel dielectric, and will not be necessary in all cases.

If there are no more pixels in the row (Step 235), the motion of the light source in the fast scan direction 50 is stopped (Step 240). If another pass of the light source is desired over the same region (Step 245), for example to transfer some of the organic material 22 that was not transferred on the just-completed pass, light source motion is started in fast scan direction 50 in the reverse direction (Step 205), a pattern of activated laser modulatable channels is selected so as to illuminate portions of secured substrate/donor element 62 that were not illuminated in an earlier pass (Step 210), and the secured substrate/donor element 62 is illuminated as described above. If no more passes are to be done over the same region of secured substrate/donor element 62 (Step 245), but there are more rows of pixels to which organic material 22 must be transferred (Step 250), the light source is moved a predetermined distance in the slow scan direction 60 (Step 255), after which the steps starting with Step 205 are repeated for the new row of pixels. If there are no more rows of pixels requiring deposited organic material 22 (Step 250), the process ends.

Figure 3B:
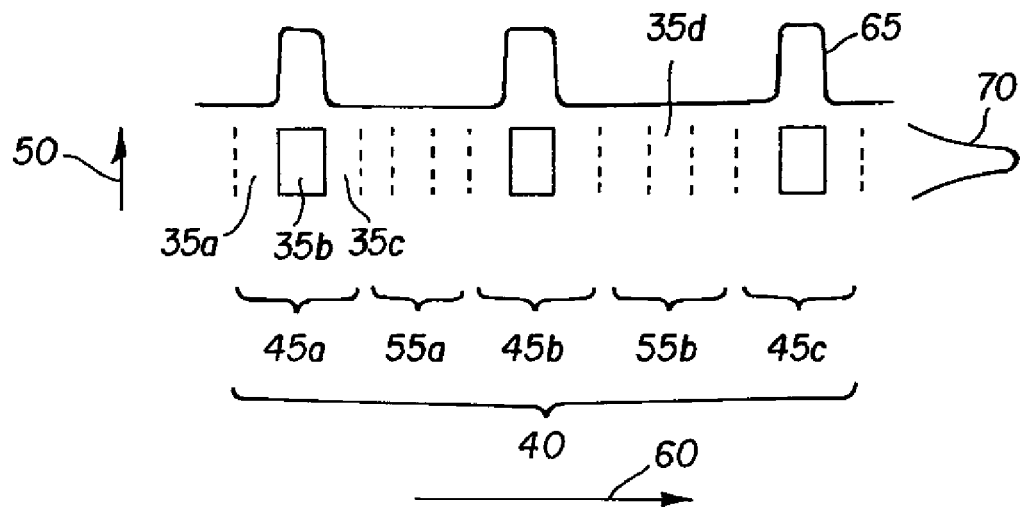
FIG. 3b shows another embodiment of a linear laser light beam that has been modulated into segments of light in accordance with this invention.
Figure 4:
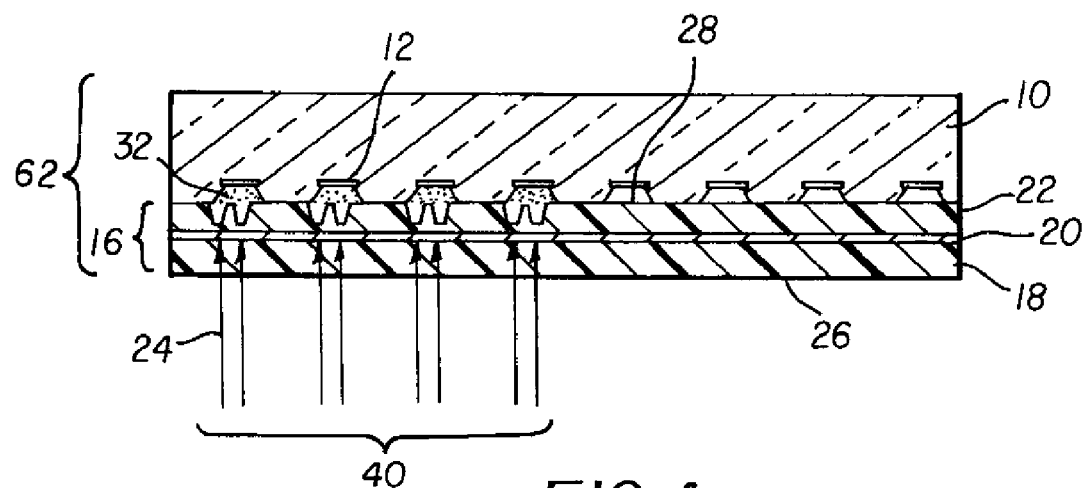
FIG. 4 shows a cross-sectional view of a method according to this invention of transferring organic material from a donor element onto a substrate of an OLED device.
Figure 7:
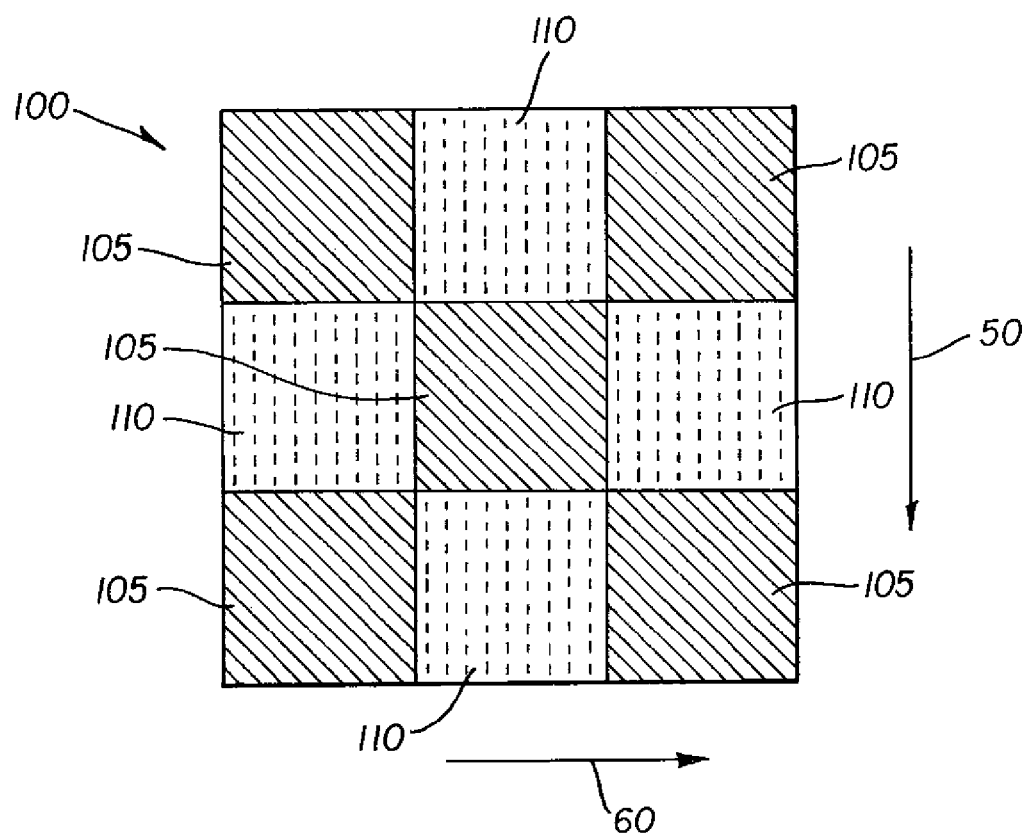
FIG. 7 shows a schematic view of a pattern of organic material deposition by the above embodiment of this invention.

Turning now to FIG. 7, and referring also to FIGS. 3a, 3b, and 6, there is shown a schematic view of a pattern of organic material deposition by the above embodiment of this invention. Pixel 100 is a single pixel of an OLED substrate 10. OLED substrate 10 was placed in a transfer relationship with donor element 16, and organic material 22 was transferred to the areas represented by deposited organic material 105 by illuminating with an alternating pattern of activated laser modulated channels, e.g. the patterns of FIGS. 3a and 3b, by the method shown in FIG. 5. Those skilled in the art will understand that vaporization transfer of this kind is not an exact transfer, and that the areas shown by the pattern of deposited organic material 105 represent an approximate pattern. After a first pass wherein organic material 22 is deposited as deposited organic material 105, one can optionally perform a second pass in the fast scan direction 50 of linear laser light beam 40 over pixel 100. During the second pass in the fast scan direction, the pattern of active laser modulatable channels is selected to vaporize different organic material 22 in different regions than during the previous pass. That is, by selecting the pattern of activated laser modulatable channels, it is possible to transfer deposited organic material 110 during the second pass. Thus, it is possible to transfer organic material 22 to the entire surface of pixel 100. The mechanistic reason for the improved device performance, such as stability, that results from this patterning process is not known in certainty. One possible benefit is that it is believed that this method reduces the density of vaporized organic material in the vapor phase and that by reducing the density of vaporized organic material 22 in the vapor phase between donor element 16 and substrate 10, lower rates of material collision and aggregated material formation occur during transfer. The material deposited by the embodiment of this invention results in an increased density of deposited organic material 105 and 110 on pixel 100 of substrate 10.

Figure 8:
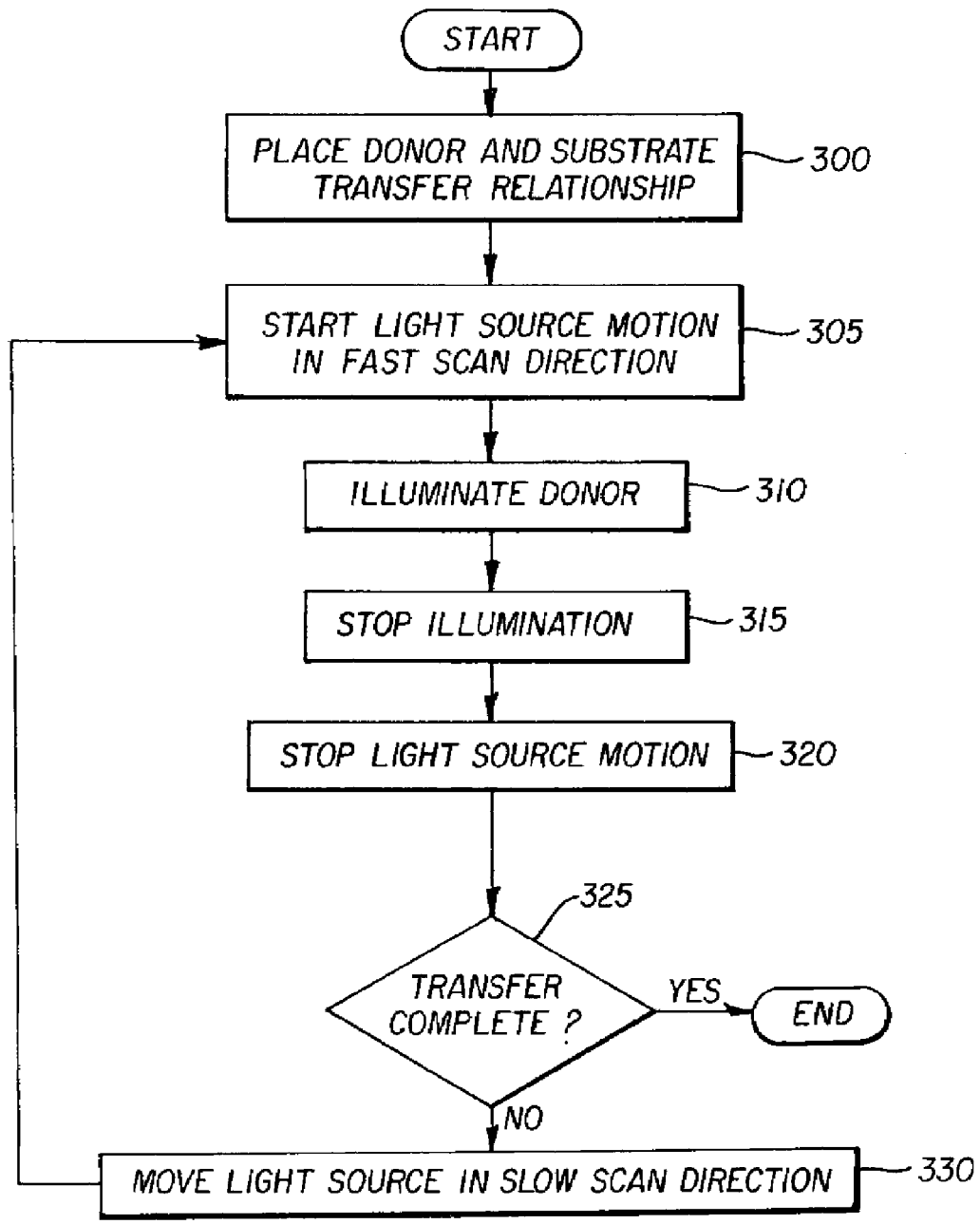
FIG. 8 is a block diagram of another embodiment of a method of transferring organic material from a donor element onto a substrate of an OLED device in accordance with this invention.

Turning now to FIG. 8, there is shown a block diagram of another embodiment of a method of transferring organic material 22 from the donor element 16 onto the substrate 10 of an OLED device in accordance with this invention. At the start, donor element 16 and substrate 10 are placed together in a transfer relationship as secured substrate/donor element 62 (Step 300). Motion of the light source is started in the fast scan direction 50 (Step 305) and selected parts of the linear laser light beam 40 illuminate secured substrate/donor element 62 (Step 310). After a predetermined distance, illumination of secured substrate/donor element 62 is stopped (Step 315), and the motion of the light source in the fast scan direction 50 is stopped (Step 320). If the transfer of organic material 22 to the surface of substrate 10 is complete (Step 325), the process ends. If the transfer is not complete, the light source is moved a predetermined distance in the slow scan direction 60 (Step 330), after which the steps starting with Step 305 are repeated for the new section of substrate 10.

Figure 9:
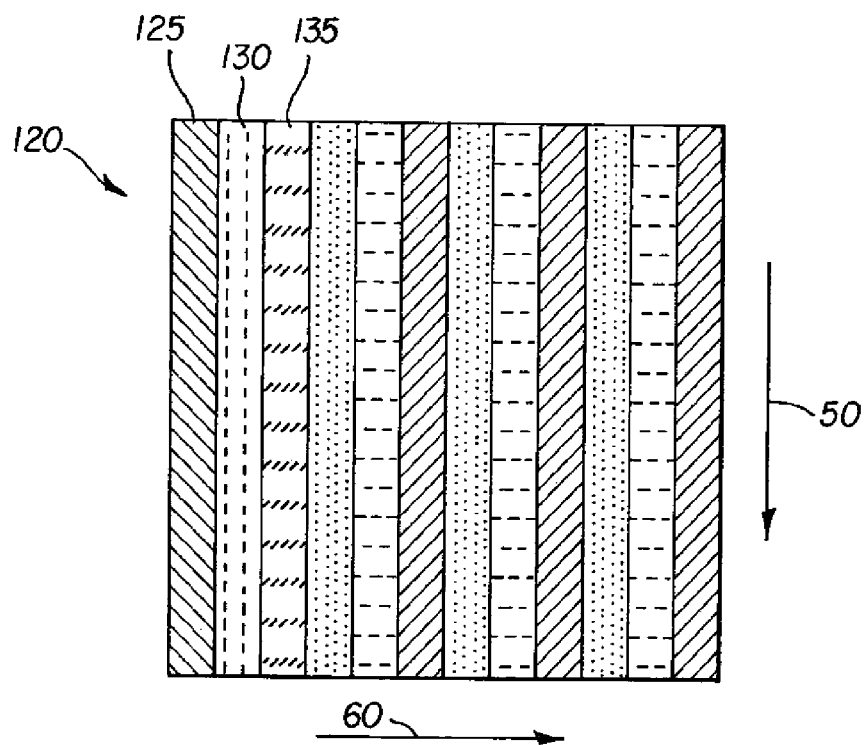
FIG. 9 shows a schematic view of a pattern of organic material deposition by the above embodiment of this invention.

Turning now to FIG. 9, and referring also to FIGS. 3b and 8, there is shown a schematic view of a pattern of organic material 22 deposition by the above embodiment of this invention. Pixel 120 is a single pixel of an OLED substrate 10. OLED substrate 10 was placed in a transfer relationship with donor element 16, and organic material 22 was transferred to the areas represented by deposited organic material 125 by illuminating with a constant pattern of activated laser modulated channels, e.g. the pattern of FIG. 3b, by the method shown in FIG. 8. Laser modulatable channel 35b was aligned so that the channel illuminated pixel 120 a portion of the width of the channel and transferred deposited organic material 125 the width of that portion. After a pass in the fast scan direction 50, linear laser light beam 40 was moved in the slow scan direction 60 a portion of the width of laser modulatable channel 35b, and a second pass in the fast scan direction 50 was performed, transferring deposited organic material 130, which is a portion of the width of laser modulatable channel 35b. A further movement in the slow scan direction 60 followed by a third pass in the fast scan direction 50 transferred deposited organic material 135, etc. Thus, linear laser light beam 40 is moved, after each pass in the fast scan direction 50, so that deposited organic material does not overlap deposited organic material from the previous pass, in part because a portion of activated laser modulatable channel 35b is illuminating a region of donor element 16 wherein organic material 22 has already been transferred, and only a portion illuminates the untransferred region of donor element 16. Thus, the instantaneous amount of organic material 22 transferred is reduced.

Figure 10:
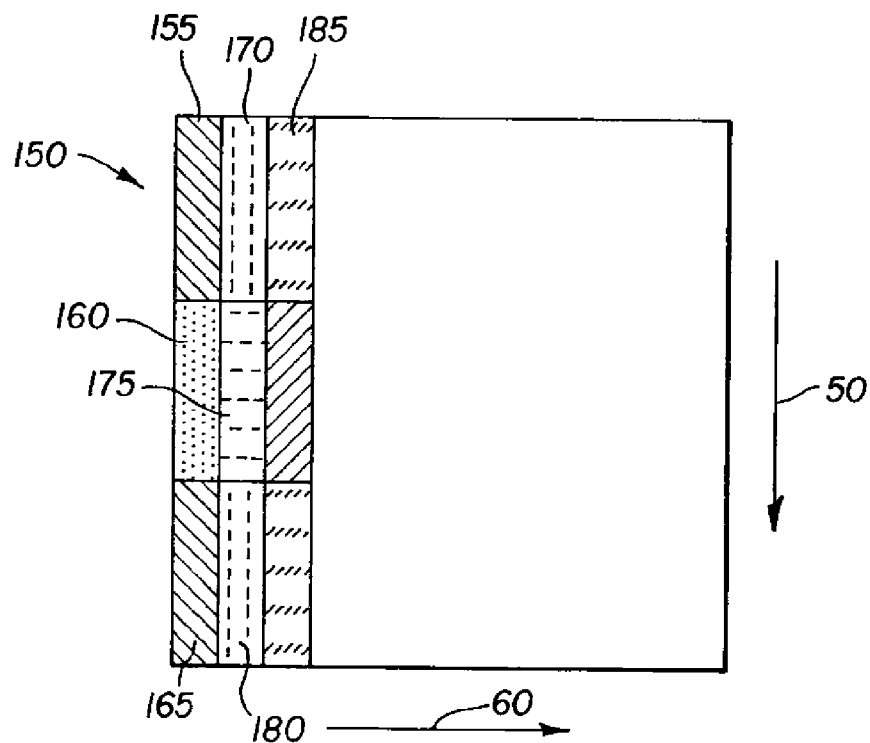
FIG. 10 shows a schematic view of a pattern of organic material deposition by another embodiment of this invention.

It is possible to combine both of these methods, as shown in FIG. 10, which is a schematic view of a pattern of organic material 22 deposition by another embodiment of this invention, and referring also to FIG. 3b. Pixel 150 is a single pixel of an OLED substrate 10. OLED substrate 10 was placed in a transfer relationship with donor element 16, and organic material 22 was transferred to areas on the substrate by illuminating with a pattern of activated laser modulated channels, e.g. the pattern of FIG. 3b. Laser modulatable channel 35b was aligned so that the channel illuminated pixel 150 a portion of the width of the channel and transferred deposited organic material 155 the width of that portion for a part of the fast scan pass. Laser modulatable channel 35b is then deactivated, and reactivated later in the pass to transfer deposited organic material 165. After a pass in the fast scan direction, linear laser light beam 40 is reversed in the fast scan direction. The pattern of activation of laser modulatable channel 35b is selected to be the reverse of the first fast scan pass so as to transfer deposited organic material 160. After a second pass in the fast scan direction 50, linear laser light beam 40 was moved in the slow scan direction 60 a portion of the width of laser modulatable channel 35b, and two passes in the fast scan direction 50 were performed, similarly transferring deposited organic material 170, 180, and 175, in that order. A further movement in the slow scan direction 60 followed by a third pass in the fast scan direction 50 transferred deposited organic material 185, etc. Thus, linear laser light beam 40 is moved, after each pass in the fast scan direction 50, so that deposited organic material does not overlap deposited organic material from the previous pass.

The invention and its advantages can be better appreciated by the following comparative examples.

DONOR ELEMENT EXAMPLE 1

A donor element for use in both the comparative and the inventive examples of OLED devices was constructed in the following manner:
1. An antireflection layer of 40 nm of silicon, an absorption layer of 40 nm of chromium, and a layer of 15 nm of aluminum were vacuum-deposited in that order onto a 51 micron polyimide donor substrate.
2. A mixed donor layer was formed over the aluminum by co-evaporating 20 nm of 2-tert-butyl-9,10-bis(2-naphthyl)anthracene (TBADN) and 0.25 nm of tetra-tert-butyl-perylene (TBP) under vacuum from separate evaporating boats.

OLED DEVICE EXAMPLE 1

(Inventive and Comparative Examples)

An OLED device with inventive and comparative areas was constructed in the following manner:
1. Onto a clean glass OLED substrate, a pattern of 40 to 80 nm transparent electrodes was created by a standard photolithography process.
2. The resulting surface was treated with a plasma oxygen etch, followed by plasma deposition of ~0.1 nm of $CF_x$.
3. A 150 nm hole-transporting layer of 4,4'-bis[N-(1-naphthyl)-N-phenylamino]biphenyl (NPB) was vacuum deposited onto the surface.
4. The donor element prepared in Donor Element Example 1 was placed on top of the NPB layer and held in proximal contact using pressure as described by Phillips in U.S. Patent Application Publication 2003-014870. A small gap of approximately one micron was maintained by the texture of the donor substrate. In regions of the OLED substrate in which emission is desired, transfer of the emissive material from the donor element was effected by irradiation through the polyimide substrate with an infrared multichannel linear laser light beam. The channel size was approximately 3 microns by 20 microns to the 1/e2 intensity point. In two inventive areas of the OLED devices, every second laser modulatable channel (1, 3, 5, 7, etc.) was activated, and this pattern was alternated with the opposite pattern (channels 2, 4, 6, etc. activated) during motion of the linear laser light beam in the fast scan direction at a velocity of 250 mm/sec. A single pass of the linear laser light beam was done. This produced an area of the OLED device that had a checkerboard pattern of alternating organic material areas and non-deposited areas, e.g. a pattern similar to that shown in FIG. 6. In a comparative area of the OLED device, 128 contiguous channels were activated. The beam was scanned in a direction perpendicular to the long dimension of the beam at a velocity of 650 mm/sec. The dwell time was 13 microseconds with an energy density of 0.3 $J/cm^2$. The comparative area is referred to as Example 1c.
5. A 30 nm electron-transporting layer of tris(8-hydroxyquinoline)aluminum (ALQ) was vacuum deposited onto the emissive layer.
6. A 0.5 nm electron-injecting layer of LiF was vacuum-deposited onto the electron-transporting layer.
7. An electrode was formed over the electron-injecting layer by depositing 100 nm aluminum by vacuum deposition.

OLED DEVICE EXAMPLE 2

(Inventive and Comparative Examples)

An OLED device satisfying the requirements of this invention was constructed as Example 1, except that in the inventive areas every third 20-micron-wide channel (channels 1, 4, 7, 10, etc.) was activated in the linear laser light beam and the beam was scanned the length of the device in a direction perpendicular to the long dimension of the beam at a velocity of 650 mm/sec. After each pass in the fast scan direction, the beam was moved 1 micron in the slow scan direction, and another pass was done in the fast scan direction. This process was repeated until the area between the stripes from the first pass was deposited with organic material, e.g. a pattern similar to that shown in FIG. 8.

OLED DEVICE EXAMPLE 3

(Inventive and Comparative Examples)

An OLED device satisfying the requirements of this invention was constructed as in Example 2, except that in the inventive areas every 12th channel (Channels 1, 13, 25, 37, etc.) was activated in the linear laser light beam.

DONOR ELEMENT EXAMPLE 2

A donor element for use in both the comparative and the inventive examples for measuring refractive index was constructed in the manner described for Donor Element Example 1, except in step 2, 40 nm of TBADN was vacuum deposited onto the aluminum layer to form a donor. No TBP was deposited onto Donor Element Example 2.

SINGLE LAYER EXAMPLES 1 TO 3

A series of single layer examples was prepared by performing the transfers of Step 4 for each of the above Examples (OLED Device Examples 1 to 3), except that Donor Element Example 2 and plain glass plates were used. This gave a series of TBADN layers on glass for measuring refractive indices of layers similar to those used in the device examples above.

Device testing had several parts. The refractive index of the single layer examples was measured by ellipsometry at 415 nm. The relative lifetime was measured by putting a constant current of 80 $mA/cm^2$ through the constructed inventive and comparative OLED devices and monitoring the intensity of the light output with time. The relative time to 50% luminance was calculated by dividing the inventive OLED device time to 50% luminance by the comparative OLED device time to 50% luminance. The blue dopant emission was detected by observing the emission spectra for the characteristic 3-peaked emission from TBP, with the strongest peak located at about 460 nm. The results are shown in Table 1.

TABLE 1

| Example # | Example Type | Relative Time to 50% Luminance | Refractive index |
|---|---|---|---|
| 1 | Inventive | 1.2 | 1.9217 |
| 1c | Comparative | 1.0 | 1.8635 |
| 2 | Inventive | 1.4 | 1.969 |

TABLE 1-continued

| Example # | Example Type | Relative Time to 50% Luminance | Refractive index |
|---|---|---|---|
| 2c | Comparative | 1.0 | 1.871 |
| 3 | Inventive | 12.2 | 1.996 |
| 3c | Comparative | 1.0 | 1.864 |

The results demonstrate that the method of this invention produces OLED devices with a longer lifetime, where lifetime is defined as the time for the luminance to decrease to 50% of the initial value. This method also gives higher refractive indices of the layer deposited by radiation thermal transfer, showing that the method described herein leads to a more even distribution of organic material than the prior art method.

SINGLE LAYER EXAMPLES 1 TO 3

A series of single layer examples was prepared by performing the transfer of Step 4 for OLED Device Example 3, except that Donor Element Example 2 and plain glass plates were used and the beam was moved 1, 2, and 4 microns (inventive examples) and 20 microns (comparative example) in the slow scan direction after each pass. This gave a series of TBADN layers on glass for measuring the density relative to an evaporated TBADN layer for different slow scan line spacings. The relative density of the 1, 2, 4, and 20 micron line spacings was calculated from the refractive indices of the single layer examples measured by ellipsometry. In addition, the density was measured for a TBADN layer deposited by a standard thermal vapor deposition process. In the standard process, TBADN is provided to the substrate at a rate of about 0.2 nm per second. To achieve this, a point source made of a pyroltic graphite is heated to about 250° C. under a chamber pressure of about $5.2 \times 10^{-7}$ Torr, and the substrate is rotated and provide at about 357 mm from the point source. The results are shown in Table 2.

TABLE 2

| Line Spacing (microns) | Example Type | Density relative to the standard process |
|---|---|---|
| 1 | Inventive | 0.99 |
| 2 | Inventive | 0.97 |
| 4 | Inventive | 0.96 |
| 20 | Comparative | 0.87 |

The results demonstrate that the method of this invention produces OLED layers with densities greater than 88% of the density as deposited by the standard thermal vapor deposition process. Under most preferred conditions the density is greater than 95% of the density as deposited by the standard thermal vapor deposition process. This invention allows OLED layers to be patterned by radiation thermal transfer and maintain physical properties nearly equal to OLED layers deposited by standard thermal vapor deposition means.

The invention has been described in detail with particular reference to certain preferred embodiments thereof, but it will be understood that variations and modifications can be effected within the spirit and scope of the invention.

PARTS LIST

| | |
|---|---|
| 10 | substrate |
| 12 | pixel |
| 14 | linear laser light beam |
| 16 | donor element |
| 18 | support |
| 20 | energy-absorbing layer |
| 22 | organic material |
| 24 | activated laser modulatable channel |
| 26 | non-transfer surface |
| 28 | transfer surface |
| 32 | deposited organic material |
| 34 | deposited organic material |
| 35a | laser modulatable channel |
| 35b | laser modulatable channel |
| 35c | laser modulatable channel |
| 35d | laser modulatable channel |
| 40 | linear laser light beam |
| 45a | pixel linear laser light beam segment |
| 45b | pixel linear laser light beam segment |
| 45c | pixel linear laser light beam segment |
| 50 | fast scan direction |
| 55a | non-pixel linear laser light beam segment |
| 55b | non-pixel linear laser light beam segment |
| 60 | slow scan direction |
| 62 | secured substrate/donor element |
| 65 | light intensity profile |
| 70 | light intensity profile |
| 75 | swath |
| 80 | multichannel laser printhead |
| 100 | pixel |
| 105 | deposited organic material |
| 110 | deposited organic material |
| 120 | pixel |
| 125 | deposited organic material |
| 130 | deposited organic material |
| 135 | deposited organic material |
| 150 | pixel |
| 155 | deposited organic material |
| 160 | deposited organic material |
| 165 | deposited organic material |
| 170 | deposited organic material |
| 175 | deposited organic material |
| 180 | deposited organic material |
| 185 | deposited organic material |
| 200 | block |
| 205 | block |
| 210 | block |
| 215 | block |
| 220 | block |
| 225 | decision block |
| 230 | block |
| 235 | decision block |
| 240 | block |
| 245 | decision block |
| 250 | decision block |
| 255 | block |
| 300 | block |
| 305 | block |
| 310 | block |
| 315 | block |
| 320 | block |
| 325 | decision block |
| 330 | block |

The invention claimed is:

1. A method of transferring organic material from a donor element onto a substrate of an OLED device, comprising:
   (a) providing a linear laser light beam which is moved relative to the donor element and substrate and which has a predetermined number of laser modulatable channels, each of which when activated causes laser light to illuminate the donor element which heats to a sufficient level to vaporize organic material and transfer such material onto a substrate; and (b) forming a pixel smaller than the linear laser light beam by selecting the pattern of activated laser modulatable channels and positioning the linear laser light beam such that only a portion of the laser light beam illuminates a portion of the donor element whereby multiple passes of the linear laser light beam relative to the donor element and substrate are needed to form the pixel.

2. The method of claim 1 wherein the dimension of each laser modulatable channel in the direction of movement is in the range of 0.1 to 50 microns.

3. The method of claim 1 wherein the linear laser light beam is moved relative to the donor element and substrate at a velocity of from 1 mm/sec to 100 m/sec.

4. The method of claim 1 wherein the pattern of activated laser modulatable channels includes activating a plurality of laser modulatable channels but not activating at least one inactivated laser modulatable channel between each of the activated laser modulatable channels.

5. The method of claim 4 wherein the pattern of activated laser modulatable channels is varied during movement so as to vaporize organic material in an alternating pattern.

6. A method of transferring organic material from a donor element onto a substrate of an OLED device, comprising:
(a) providing a linear laser light beam which is movable in fast and slow scan directions relative to the donor element and substrate and has a predetermined number of laser modulatable channels, each of which when activated causes laser light to illuminate the donor element which heats to a sufficient level to vaporize organic material and transfer such material onto a substrate; and
(b) forming a pixel smaller than the linear laser light beam by selecting the pattern of activated laser modulatable channels and positioning the linear laser light beam such that only a portion of the laser light beam illuminates a portion of the donor element whereby multiple passes of the linear laser light beam relative to the donor element and substrate are needed to form the pixel.

7. The method of claim 6 wherein the dimension of each laser modulatable channel in the fast scan direction of movement is in the range of 0.1 to 50 microns, and the dimension of each laser modulatable channel in the slow scan direction of movement is in the range of 0.1 microns to 1 mm.

8. The method of claim 6 wherein the linear laser light beam is moved relative to the donor element and substrate in the fast scan direction at a velocity of from 1 mm/sec to 100 m/sec.

9. The method of claim 6 wherein the pattern of activated laser modulatable channels includes activating a plurality of laser modulatable channels but not activating at least one inactivated laser modulatable channel between each of the activated laser modulatable channels.

10. The method of claim 9 wherein the pattern of activated laser modulatable channels is varied during movement in the fast scan direction so as to vaporize organic material in an alternating pattern.

11. The method of claim 6 wherein the linear laser light beam after a pass in the fast scan direction is moved so that the deposited organic material does not overlap deposited organic material from a previous pass.

12. A method of transferring organic material from a donor element onto a substrate of an OLED device, comprising:
(a) providing a linear laser light beam which is movable in multiple fast and slow scan passes relative to the donor element and substrate and has at least two passes in each fast scan direction and has a predetermined number of laser modulatable channels, each of which when activated causes laser light to illuminate the donor element which heats to a sufficient level to vaporize organic material and transfer such material onto a substrate; and
(b) forming a pixel smaller than the linear laser light beam by selecting the pattern of activated laser modulatable channels and positioning the linear laser light beam such that only a portion of the laser light beam illuminates a portion of the donor element whereby multiple-passes of the linear laser light beam relative to the donor element and substrate are needed to form the pixel.

13. The method of claim 12 wherein the dimension of each laser modulatable channel in the fast scan direction of movement is in the range of 0.1 to 50 microns, and the dimension of each laser modulatable channel in the slow scan direction of movement is in the range of 0.1 microns to 1 mm.

14. The method of claim 12 wherein the linear laser light beam is moved relative to the donor element and substrate in the fast scan direction at a velocity of from 1 mm/sec to 100 m/sec.

15. The method of claim 12 wherein the pattern of activated laser modulatable channels includes activating a plurality of laser modulatable channels but not activating at least one inactivated laser modulatable channel between each of the activated laser modulatable channels.

16. The method of claim 15 wherein the pattern of activated laser modulatable channels is varied during movement in the fast scan direction so as to vaporize organic material in an alternating pattern.

17. The method of claim 16 wherein the pattern of active laser modulatable channels during a second pass in the fast scan direction is selected to vaporize different organic material in different regions than during a previous pass.

18. The method of claim 12 wherein the linear laser light beam after a pass in the fast scan direction is moved so that the deposited organic material does not overlap deposited material from the previous pass.

* * * * *